United States Patent
Schulze et al.

(10) Patent No.: US 10,566,198 B2
(45) Date of Patent: Feb. 18, 2020

(54) DOPING METHOD

(71) Applicant: Infineon Technologies AG, Neubiberg (DE)

(72) Inventors: Hans-Joachim Schulze, Taufkirchen (DE); Johannes Baumgartl, Riegersdorf (AT); Helmut Oefner, Zorneding (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/135,805

(22) Filed: Sep. 19, 2018

(65) Prior Publication Data

US 2019/0088482 A1    Mar. 21, 2019

(30) Foreign Application Priority Data

Sep. 19, 2017   (DE) .......................... 10 2017 121 693

(51) Int. Cl.
*H01L 21/22* (2006.01)
*H01L 21/02* (2006.01)
*H01L 21/266* (2006.01)

(52) U.S. Cl.
CPC ...... *H01L 21/2205* (2013.01); *H01L 21/0262* (2013.01); *H01L 21/266* (2013.01)

(58) Field of Classification Search
CPC ............... H01L 29/1083; H01L 29/732; H01L 21/02661; H01L 29/1095; H01L 29/7393; H01L 29/7392; H01L 29/7394
See application file for complete search history.

(56) References Cited

U.S. PATENT DOCUMENTS

| | | | |
|---|---|---|---|
| 4,170,501 A | 10/1979 | Khajezadeh | |
| 6,313,484 B1 * | 11/2001 | Ohkubo | H01L 27/1443 257/343 |
| 6,570,229 B1 * | 5/2003 | Harada | H01L 27/0623 257/373 |
| 8,449,675 B2 * | 5/2013 | Krautbauer | H01L 29/36 117/101 |
| 2010/0116329 A1 | 5/2010 | Fitzgerald et al. | |

FOREIGN PATENT DOCUMENTS

| | | |
|---|---|---|
| DE | 19853743 A1 | 5/2000 |
| DE | 102016113819 A1 | 5/2017 |
| JP | H01207964 A | 8/1989 |

* cited by examiner

*Primary Examiner* — Jaehwan Oh
(74) *Attorney, Agent, or Firm* — Slater Matsil, LLP

(57) ABSTRACT

A first dose of first dopants is introduced into a semiconductor body having a first surface. A thickness of the semiconductor body is increased by forming a first semiconductor layer on the first surface of the semiconductor body. While forming the first semiconductor layer a final dose of doping in the first semiconductor layer is predominantly set by introducing at least 20% of the first dopants from the semiconductor body into the first semiconductor layer.

23 Claims, 12 Drawing Sheets

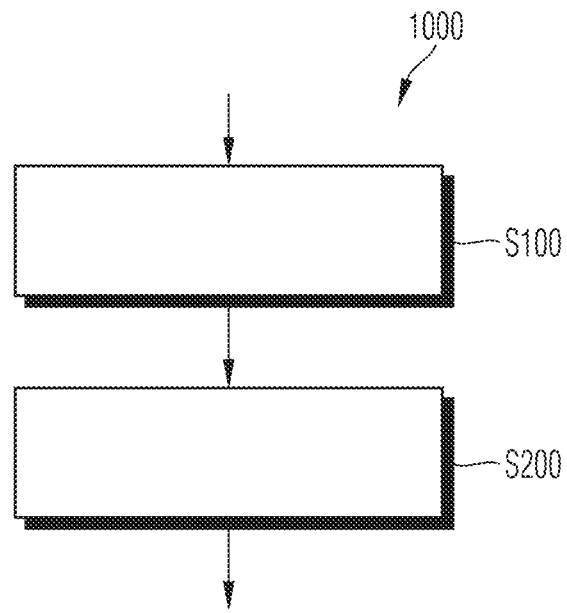
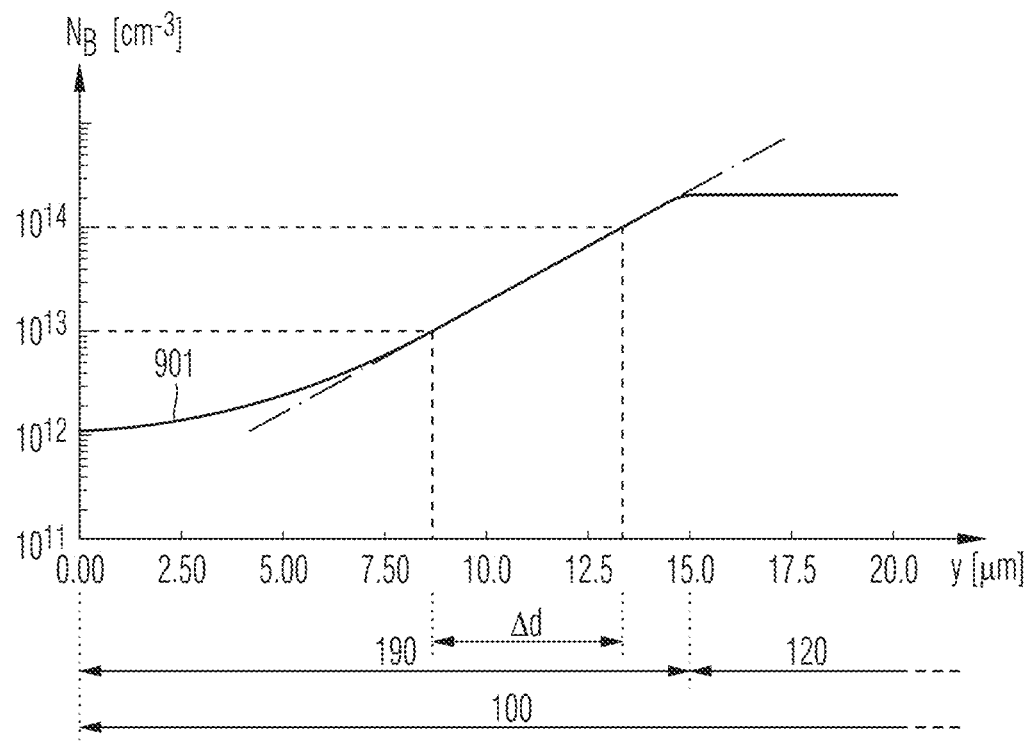

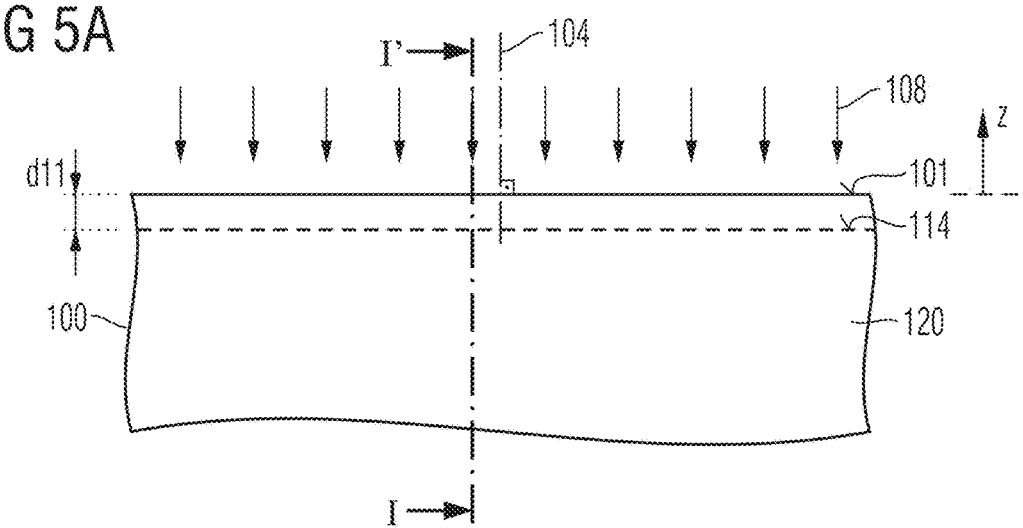
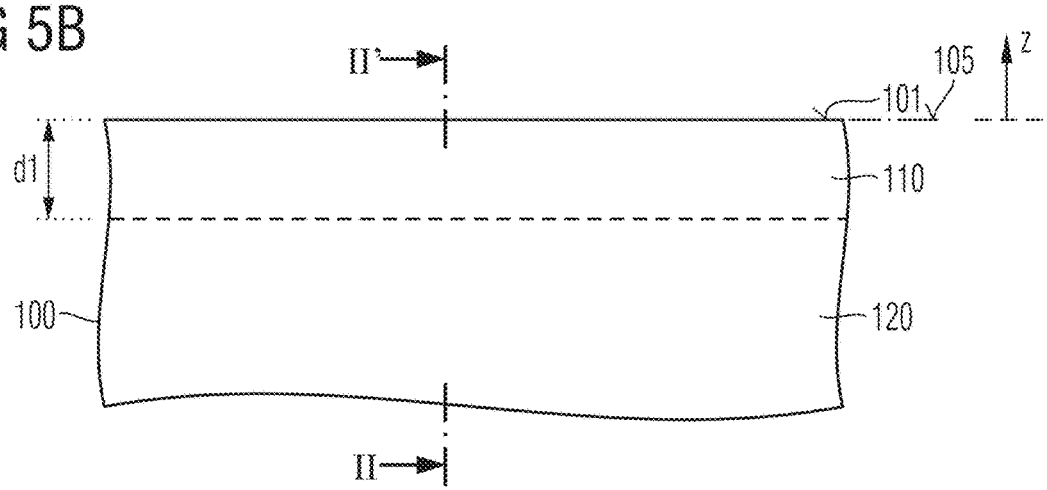
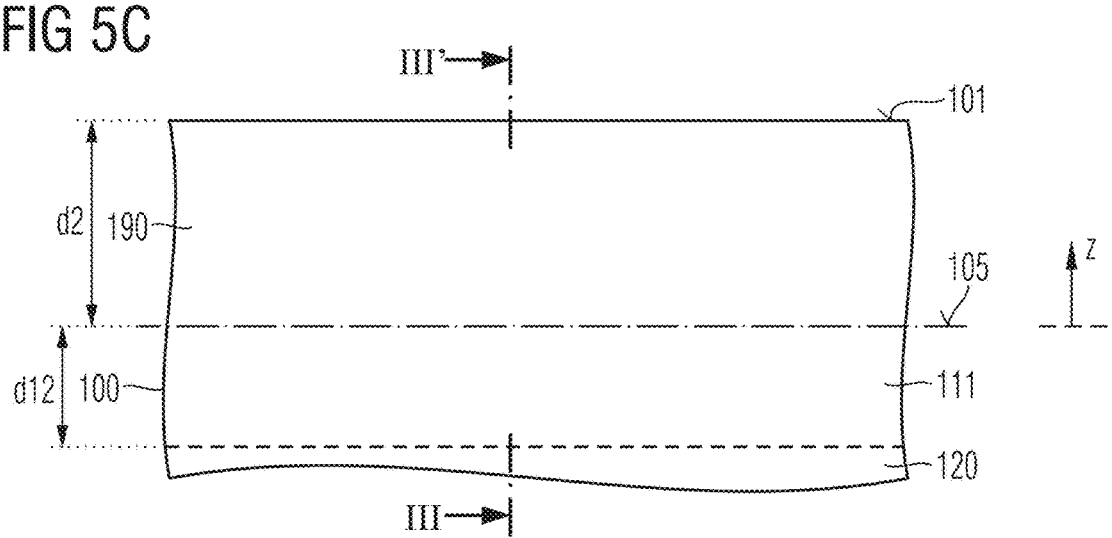

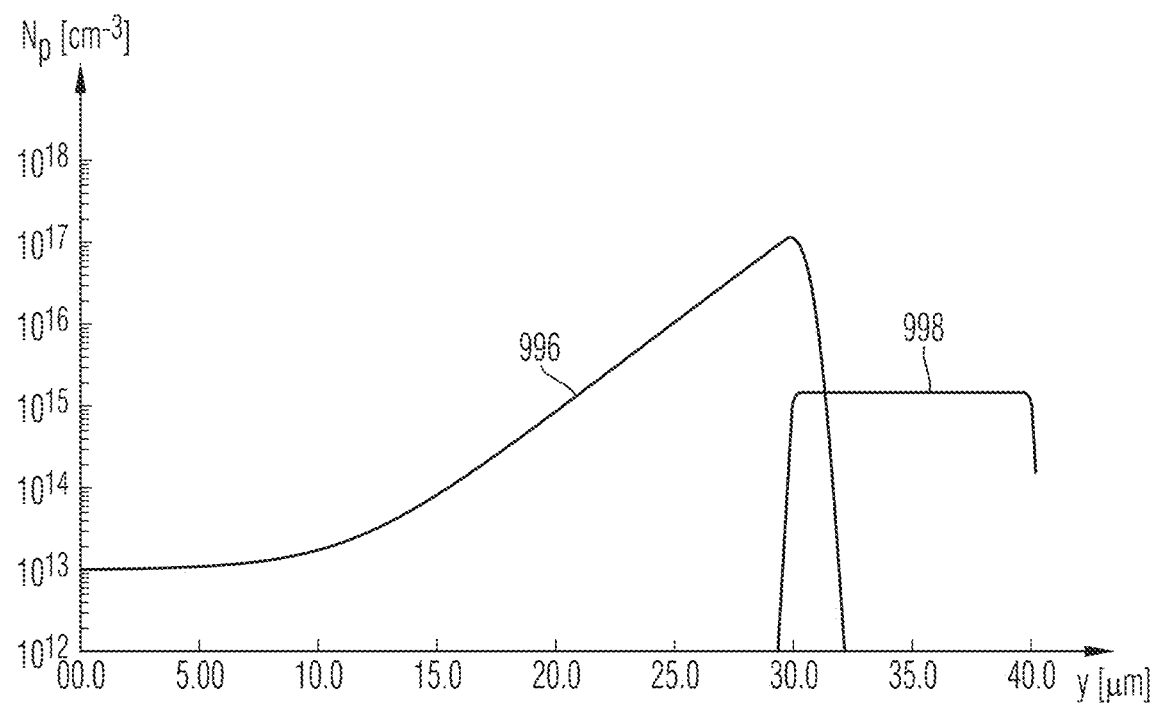

DOPING METHOD

This application claims the benefit of German Application No. 102017121693.6, filed on Sep. 19, 2017, which application is hereby incorporated herein by reference.

TECHNICAL FIELD

The present invention relates generally to a method of manufacturing semiconductor devices and more specifically to a doping method of a semiconductor body.

BACKGROUND

Vertical power semiconductor devices that control a load current flow between a first load electrode at a front side and a second load electrode at a rear side of a semiconductor die typically include doped regions that are formed in semiconductor layers, e.g., drift zones, compensation structures, buffer layers and/or field stop layers.

Properties of vertical dopant profiles of such doped regions, for example, steepness, uniformity, smoothness and undulation may have substantial impact on device parameters. Typically, a vertical dopant profile in an epitaxial layer is shaped by controlling a doping gas supply with time or by ion implantation followed by a heat treatment for diffusing the implanted dopants.

There is a need for an improved doping method and for semiconductor devices with improved dopant profiles.

SUMMARY

The present disclosure relates to a method of manufacturing semiconductor devices. The method includes i) introducing a first dose of first dopants into a semiconductor body having a first surface, ii) increasing a thickness of the semiconductor by forming a first semiconductor layer on the first surface of the semiconductor body. While forming the first semiconductor layer, a final dose of doping in the first semiconductor layer is set by introducing at least 20% of the first dopants from the semiconductor body into at least a part of the first semiconductor layer.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 1 is a simplified flow-chart for illustrating a doping method;

FIG. 2A is a schematic graph illustrating a vertical dopant profile according to a simulation of effects of auto-doping for discussing background of the embodiments;

FIG. 5A is a schematic vertical cross-sectional view of a portion of a semiconductor body for illustrating a doping method according to an embodiment defining a dopant dose by ion implantation, during ion implantation of dopants into the semiconductor body;

FIG. 5B is a schematic vertical cross-sectional view of the semiconductor body of FIG. 5A, after a heat treatment;

FIG. 5C is a schematic vertical cross-sectional view of the semiconductor body of FIG. 5B, after increasing the thickness of the semiconductor body by epitaxy;

FIG. 10 is a schematic graph illustrating a vertical dopant profile pivotally obtained by auto-doping according to a further embodiment.

DETAILED DESCRIPTION OF ILLUSTRATIVE EMBODIMENTS

Figure 2B:
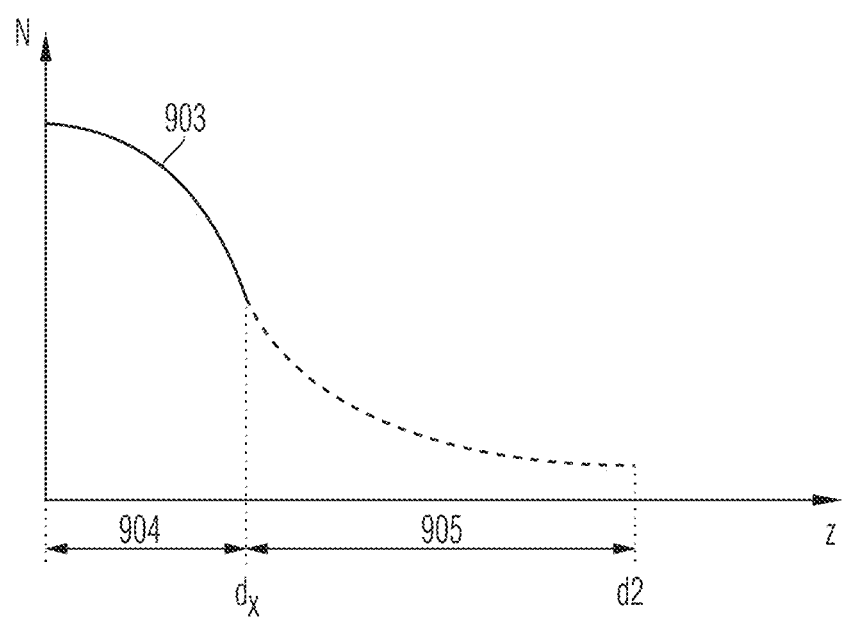
FIG. 2B is a schematic graph illustrating the effects of solid-state diffusion and auto-doping on a vertical dopant profile for discussing background of the embodiments.

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

FIG. 1 is a schematic flow-chart for illustrating a doping method 1000. It will be appreciated that while doping method 1000 is illustrated and described below as a series of steps or events, the illustrated ordering of such steps or events is not to be interpreted in a limiting sense. For example, the steps may occur concurrently with other steps or events apart from those illustrated and/or described herein. In addition, not all steps may be required to implement one or more aspects of embodiments of the disclosure herein. Also, one or more of the steps depicted herein may be divided in one or more separate sub-steps and/or phases.

Referring to FIG. 1, process feature S100 includes introducing a first dose of first dopants into a semiconductor body having a first surface. The semiconductor body may be a of a single-crystalline semiconductor material such as a silicon (Si) wafer, a germanium (Ge) wafer, a silicon carbide (SiC) wafer or a wafer of a compound semiconductor, e.g., gallium nitride (GaN) or gallium arsenide (GaAs). The first dopants may be any impurity element that alters the electrical properties of the semiconductor body. For example, in case the semiconductor body is based on silicon, the first dopants may include boron (B), phosphorus (P), arsenic (As), antimony (Sb) sulfur (S) or selenium (Se) atoms, by way of example. For example, in case the semiconductor body is based on silicon carbide, the first dopants may include nitrogen (N) and phosphorus (P) for n-type doping, by way of example.

The first dopants may be introduced through a first surface of the semiconductor body by ion implantation, by way of example. A surface portion, in which the first dopants dominate exceed dopants already contained in the semiconductor body, may be a blanket layer extending at uniform thickness along the first surface or may be a patterned layer selectively formed along first portions of the first surface and absent along second portions of the first surface.

Process feature S200 increases the thickness of the semiconductor body by forming a first semiconductor layer, for example a Si or SiC layer on the original first surface of the semiconductor body. During formation of the first semiconductor layer a final dopant dose and doping profile in the first semiconductor layer is set by transferring at least 20%, or at least 30%, or at least 50% or at least 70% of the first dopants from the surface portion of the semiconductor body into the first semiconductor layer. In other words, at least 20% of the first dopants present in the surface of the semiconductor body before formation of the first semiconductor layer migrate into the first semiconductor layer.

The first dopants may reach the first semiconductor layer by both solid-state diffusion and auto-doping. Solid-state diffusion results in a direct transition of dopant atoms from the surface portion into the first semiconductor layer. By contrast, for auto-doping the surface portion releases dopants into the ambient atmosphere through evaporation and the growing semiconductor layer reincorporates the released dopants. If the growth velocity of the semiconductor layer substantially exceeds the direct solid-state diffusion of dopants from the surface portion into the semiconductor layer, a portion of the resulting dopant profile in the semiconductor layer at a distance to the surface portion is dominated by dopants re-introduced after evaporation from the semiconductor body.

Since dopant evaporation from the semiconductor body is supplied from the surface portion by solid-state diffusion, the total number of evaporated dopants for auto-doping steadily decreases with increasing thickness of the semiconductor layer.

Auto-doping may be combined with intentional doping, wherein a gaseous dopant source containing a compound including the dopant atom is added to a gaseous semiconductor source that contains atoms of the semiconductor material. For example, up to 50% of the total dopant dose in the semiconductor layer may originate from an added dopant source. According to an embodiment, the supply of the gaseous dopant source into the deposition chamber may be completely turned off during formation of the semiconductor layer such that a total dose of dopants in the semiconductor layer as well as the vertical dopant profile are exclusively set by auto-doping and solid-state diffusion. The degree of auto-doping depends also on the epitaxy tool, wherein on batch tools the effect of auto-doping is more pronounced than in single wafer epitaxy tools.

Compared to other doping methods for epitaxially grown semiconductor layers, the doping method 1000 produces vertical doping profiles with comparatively smooth gradients or even with several smooth gradients that extend over a comparatively large vertical distance of at least 5 μm at high reproducibility, high homogeneity and precise total dopant dose across the semiconductor layer and the remaining diffused surface portion below the semiconductor layer at comparatively low effort. Several smooth gradients can be achieved for example by using different doping atoms with different diffusion coefficients like e.g. phosphorus and arsenic and/or antimony. For example, a dopant concentration in the epitaxially grown semiconductor layer may fall by two orders of magnitude across at least 3 µm or 5 µm or even 10 µm. At high doping concentration the doping profile can be steeper compared with low doping.

For example, conventional in-situ doping defines a vertical dopant profile in an epitaxial layer by varying the supply of a gaseous dopant source with time. But typically in-situ doping results in variations of the total dopant dose in the epitaxial layer. In addition reproducibility, smoothness and homogeneity of specific dopant profiles may be unsatisfactory. In general, in-situ doping of epitaxial layers results in comparatively large fluctuations of the total dopant dose and achieving well defined vertical dopant profiles at small tolerances is a complex task, for example for low doping concentrations.

When shaping, on the other hand, vertical dopant profiles by ion implants followed by a subsequent heat treatment, even comparatively high thermal budgets result in only small diffusion depths.

By contrast, the doping method woo uses auto-doping in order to provide reproducible results and homogeneously smooth profiles at no or only low additional thermal budget.

According to an embodiment, the first dose of first dopants is introduced by ion implantation. Ion implants can supply a very precise amount of dopants such that the total dopant dose contained in the first semiconductor layer and the diffused surface portion below the first semiconductor layer are precisely defined. The same holds for such device parameters that are linked to the total dopant dose in the first semiconductor layer and the diffused surface portion. Ion implants at low acceleration energies for the ions achieve high dopant concentrations close to the first surface such that the effect of auto-doping on the dopant profile in the first semiconductor layer prevails the effect of solid state diffusion to a higher degree. For example, the acceleration energy of phosphorus ions used as the first dopants may be less than 150 keV or less than 100 keV or even less than 50 keV.

According to an embodiment introduction of the first dose of first dopants may include a sequence of several implants at different ion implantation energies and/or implant angles. For example, at least one ion implantation may be performed at an implant angle at which channeling occurs. According to a further embodiment, a heat treatment may diffuse the implanted dopants prior to the formation of the first semiconductor layer to modulate the vertical dopant profile in the surface portion of the semiconductor body before formation of the first semiconductor layer. Since the auto-doping profile in the first semiconductor layer depends on the vertical distribution of the first dopants in the surface portion, a modulation of the vertical dopant profile in the surface portion leads to a modulation of the vertical dopant profile in the first semiconductor layer. Shaping the doping profile in the surface portion by several implants and/or heat treatments adds further degrees of freedom for shaping the vertical target doping profile in the first semiconductor layer.

According to another embodiment, introducing the first dose of first dopants may include in-diffusion from the gaseous phase. According to a further embodiment, a surface portion forming a blanket layer may be an in-situ doped epitaxial layer formed prior to the formation of the first semiconductor layer. Also highly doped oxides, e.g. TEOS (tetraethylorthosilane) may be deposited at low temperatures on the first surface and/or in trenches extending from the first surface into the semiconductor body and a high temperature heat treatment may diffuse the first dopants from the deposited oxide into the semiconductor body.

According to another embodiment at least two different types of dopant atoms are introduced into the semiconductor body, e.g. phosphorus atoms and arsenic atoms, and/or antimony atoms.

According to another embodiment an additional thin doped layer may be deposited on the semiconductor body, e.g., by epitaxy, wherein the first dopants are introduced into the additional thin in-situ doped layer. The dopants may be introduced by in-situ doping, ion implantation or diffusion from a diffusion source, for example. A thickness of the thin doped layer may range from 0.1 µm to 5 µm.

A thickness of the first semiconductor layer may be in a range from 5 µm to 35 µm. A semiconductor layer with a thickness in the range from 5 µm to 35 µm may form, e.g., a field stop layer. Field stop layers with smooth and well-defined vertical dopant profiles allow to improve at least one of softness during turn-off, short-circuit ruggedness and ruggedness against cosmic radiation events.

A second semiconductor layer may be formed by epitaxy on the first semiconductor layer, wherein an average doping concentration in the second semiconductor layer is lower than a minimum dopant concentration in the first semiconductor layer.

According to another embodiment, a first semiconductor layer with a thickness in a range from 2 µm to 200 µm or with a thickness in a range from 40 to 100 µm may provide the basis for a drift zone that includes a superjunction structure. For example, in addition to the first dose of first dopants a second dose of second dopants may be introduced into the semiconductor body through the first surface, wherein the second dopants have a conductivity type complementary to the conductivity type of the first dopants and wherein the first and the second dopants have different diffusion constants for solid-state diffusion. By implementing trench structures which will be filled with e.g. the same semiconductor material with e.g. low doping level the resulting different lateral outdiffusion during a subsequent high-temperature treatment results in a separation of the different doping atoms (like e.g. boron and arsenic atoms), so that a superjunction structure will be formed in that way.

According to an embodiment, the first dopants include phosphorus atoms and the first semiconductor layer is formed in a deposition chamber at a deposition temperature above 1100° C., at a pressure below 30 Torr (4 kPa) and at a $H_2$ flow rate lower than 30 slm, wherein a deposition rate of at least 1 µm/min, effective out-diffusion of phosphorus atoms during epitaxial growth and effective auto-doping are achieved.

According to another embodiment the first dopants include boron atoms and the first semiconductor layer is formed in a deposition chamber at a deposition temperature above 1100° C., at a pressure below 30 Torr (4 kPA) and at an HCl flow rate in a range from 0.2 to 1 slm, wherein a deposition rate of at least 1 µm/min, effective out-diffusion of boron atoms during epitaxial growth and effective auto-doping are achieved.

According to another embodiment the first dopants are arsenic atoms, the first semiconductor layer is formed at a deposition temperature above 1100° C. at a pressure in the deposition chamber of more than 100 Torr (13.3 kPa) or up to atmospheric pressure to achieve a deposition rate of at least 1 µm/min, effective out-diffusion of arsenic atoms during epitaxial growth and effective auto-doping are achieved.

According to an embodiment at least one of a deposition temperature, a pressure in the deposition chamber and a semiconductor source supply flow rate can be varied during formation of the first semiconductor layer to modulate the vertical dopant profile in the first semiconductor layer.

FIG. 2A illustrates a boron concentration $N_B(y)$ in a semiconductor body versus a distance y to an exposed first surface of the semiconductor body and shows a simulated vertical dopant profile 901 in the semiconductor body 100, wherein the semiconductor body 100 includes a homogenously doped substrate portion 120 and a semiconductor layer 190 formed by epitaxy on the substrate portion 120. The substrate portion 120 has a resistivity of 60 Ohm×cm and contains a homogenous boron concentration of $2.2 \times 10^{14}$ $1/cm^3$. The temperature applied during epitaxy is 1135° C., an initial boron contamination is $5 \times 10^{-14}$ bar and a deposition rate is 3 μm/min. The simulated vertical dopant profile 901 is taken at a thickness of the semiconductor layer of 15 μm.

In the semiconductor layer 190, the simulated dopant profile 901 is exclusively defined by solid-state diffusion and by auto-doping from the substrate portion 120. The boron concentration $N_B(z)$ falls by two orders of magnitude across a vertical distance of about 10 μm, wherein a steepness of the simulated vertical dopant profile 901 is less than one order of magnitude $N_B$ per 4.5 μm. From a comparative dopant profile obtained by a process dominated by solid-state diffusion and with the same temperature budget applied, the simulated vertical dopant profile 901 differs by the less steep decrease.

FIG. 2B schematically shows a vertical dopant profile 903, that gives a dopant concentration N(z) in an epitaxially grown semiconductor layer as a function of the distance z to a starting surface for the epitaxy process. The semiconductor layer has a vertical extension d2. In a first region 904 of the semiconductor layer up to a distance dx from the starting surface, the vertical dopant profile 903 is dominated by solid-state diffusion and approximates a Gaussian distribution. In a second region 905 beyond the distance dx the effect of auto-doping exceeds the effect of solid-state diffusion and the vertical dopant profile 903 is significantly less steep than it would be in the absence of auto-doping.

According to an embodiment the vertical extension $d_y = d2 - d_x$ of the second region 905 may be at least two times larger than the first region 904. For example, $d_y$ is in a range from $2 \times d_x$ to $5 \times d_x$.

FIGS. 3A to 3D illustrate a method using accentuated auto-doping by vertical cross-sections through a semiconductor body 100.

Figure 3A:
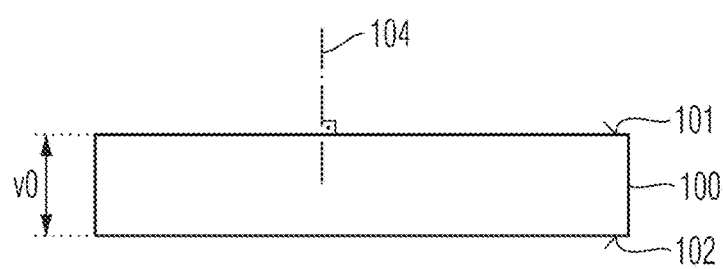
FIG. 3A is a schematic vertical cross-sectional view of a semiconductor body for illustrating a doping method using auto-doping according to an embodiment.

FIG. 3A shows a semiconductor body 100, which may be from a single-crystalline semiconductor material, e.g., Si, Ge, SiGe, SiC, or a compound semiconductor, for example, an $A_{111}BV$ compound semiconductor such as GaN or GaAs. The semiconductor body 100 may be a flat disk, e.g., a semiconductor wafer, with a planar first surface 101 at a front side and a planar second surface 102 parallel to the first surface 101 at an opposite rear side. A thickness v0 of the semiconductor body 100 between the first surface 101 and the second surface 102 may be in a range from 50 μm to 800 μm.

A normal 104 to the first surface 101 defines a vertical direction and directions parallel to the first surface 101 are horizontal or lateral directions. The semiconductor body 100 may be low-resistive or high-resistive and may be cut from a single-crystalline ingot obtained by a float zone (FZ) method or a Czochralski (CZ) method, for example, by a Magnetic Czochralski (MCZ) method. Thus, the semiconductor body 100 may be a FZ semiconductor body or a CZ semiconductor body such as a MCZ semiconductor body.

A surface portion 110 of the semiconductor body along the first surface 101 contains at least a first dose of first dopants. The surface portion 110 may be formed by at least one of ion implantation, diffusion from the gaseous phase and deposition of a doped layer, wherein ion implantation may be combined with a heat treatment for bringing the implanted dopants closer to the first surface.

Figure 3B:
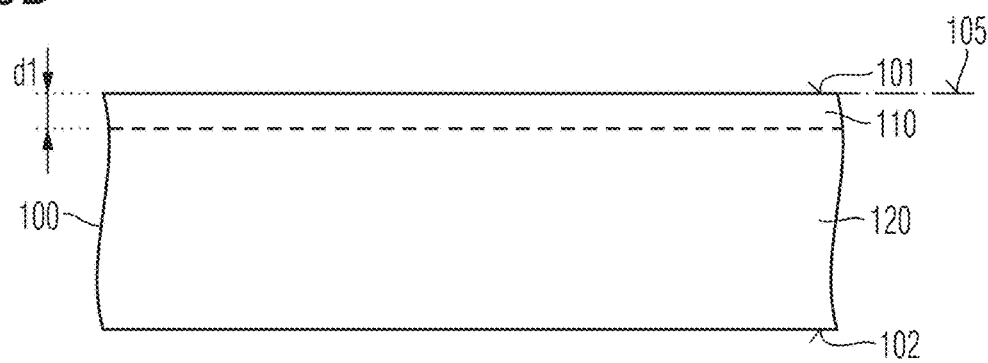
FIG. 3B is a schematic vertical cross-sectional view of the semiconductor body of FIG. 3A, after introducing first dopants in a surface portion.

FIG. 3B shows the surface portion no, which may form a blanket layer directly adjoining the first surface 101. A first vertical extension d1 of the surface portion 110 may be in a range from 0.02 μm to 2 μm, or in a range from 0.05 μm to 1 μm, by way of example.

An unaffected substrate portion 120 of the semiconductor body 100 between the surface portion 110 and the second surface 102 may separate the surface portion 110 from the second surface 102. In the unaffected substrate portion 120 the portion of the first dopants is less than the portion of the dopants contained in the semiconductor body 100 before introduction of the first dopants.

The first surface 101 forms a starting plane 105 for a semiconductor layer 190 that is formed by epitaxy on the first surface 101. The thermal budget applied to the semiconductor body 100 during epitaxy may diffuse a part of the first dopants also into the direction of the second surface 102 such that the surface portion 110 of FIG. 3B expands at the expense of the unaffected substrate portion 120.

Figure 3C:
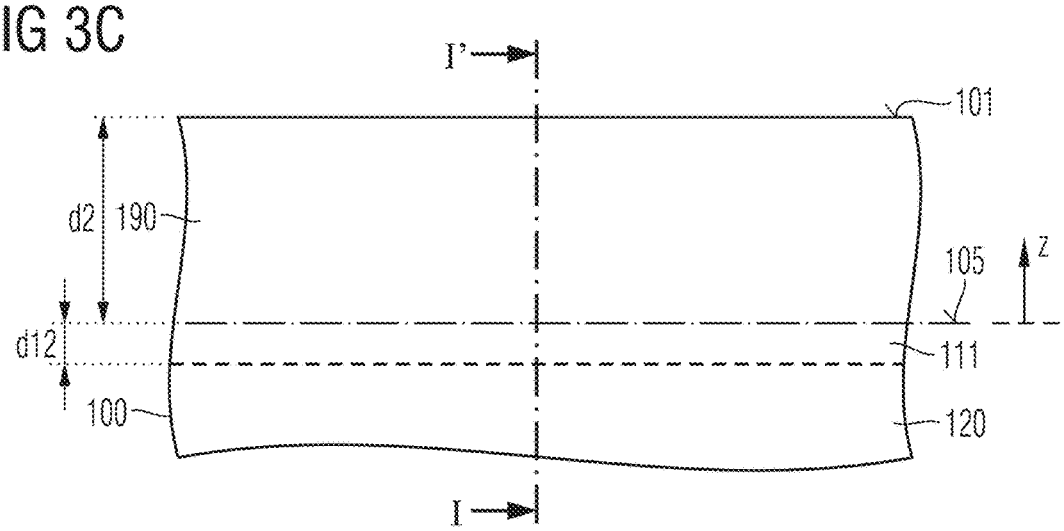
FIG. 3C is a schematic vertical cross-sectional view of the semiconductor body of FIG. 3B, after increasing a thickness of the semiconductor body.

FIG. 3C shows the semiconductor layer 190 that increases the thickness of the semiconductor body 100, wherein an exposed surface of the semiconductor layer 190 forms the new first surface 101 of the semiconductor body 100. A vertical extension d2 of the semiconductor layer 190 between the first surface 101 and the starting plane 105 may be in a range from 2 μm to 200 μm, for example in a range from 5 μm to 120 μm or in a range from 7 μm to 100 μm. A portion of the semiconductor layer 190, in which the dopant concentration is dominated by auto-doping is at least two to five times thicker than a region predominantly defined by solid-state diffusion.

A vertical extension d12 of the diffused surface portion 111 may be greater than the first vertical extension d1 of the surface portion prior to the formation of the semiconductor layer 190. A dopant dose in the diffused surface portion 111 may be up to a half of the first dopant dose.

Figure 3D:
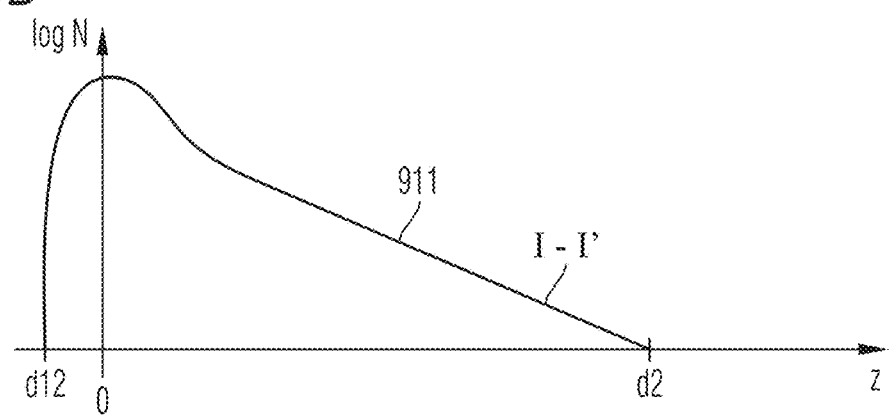
FIG. 3D is a schematic graph illustrating a vertical dopant profile of the semiconductor body of FIG. 3C along line I-I'.

FIG. 3D shows a vertical dopant profile 911 through the semiconductor body 100 of FIG. 3C along line I-I' at logarithmic scale, wherein z=0 indicates the starting plane 105 of FIG. 3C. For z<0, the dopant profile 911 exclusively results from solid-state diffusion of the first dopants into direction of the second surface, wherein the dopant profile falls according to a Gaussian distribution. For z>0 the vertical dopant profile 911 strictly falls from a maximum value at z=0 to a minimum value at a significantly lower rate than for z<0.

Figure 4A:
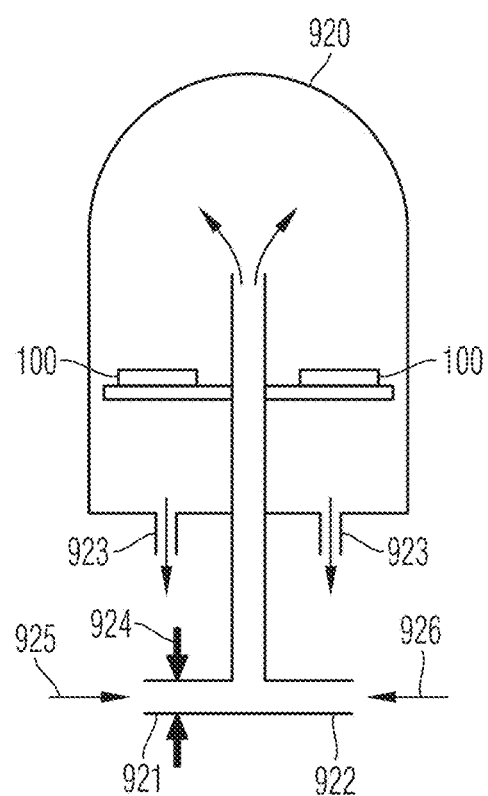
FIG. 4A is a schematic cross-sectional view of a deposition chamber for illustrating a doping method according to an embodiment concerning epitaxial growth without doping gas supply.
Figure 4B:
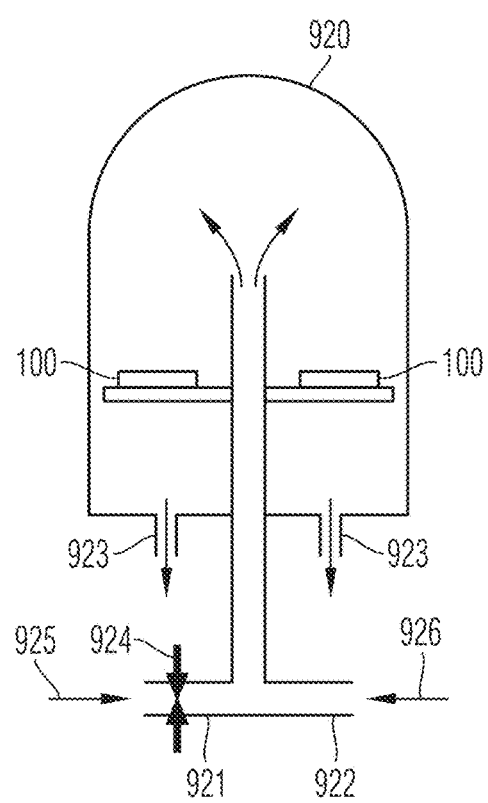
FIG. 4B is a schematic vertical cross-sectional view of the deposition chamber of FIG. 4A with a doping gas supply turned off.

FIGS. 4A and 4B schematically show a deposition chamber 920 with inlets 921, 922 and outlets 923 for process gases. One or more semiconductor bodies 100 are placed in the interior of the deposition chamber 920.

According to FIG. 4A a gaseous dopant source 925 containing a compound including dopant atoms can be fed through a first inlet 921 and a gaseous semiconductor source 926 containing a compound including semiconductor atoms is fed through a second inlet 922 into the deposition chamber 920.

During deposition of a semiconductor layer, a control valve 924 may turn off the supply of the gaseous dopant source 925 as illustrated in FIG. 4B over all or part of the deposition process time.

FIGS. 5A to 5D show an embodiment with the vertical dopant profile in an epitaxial grown semiconductor layer 190 shaped by ion implants followed by a heat treatment prior to formation of the semiconductor layer 190.

FIG. 5A shows formation of a surface portion forming a blanket layer of uniform thickness along a first surface 101 of a semiconductor body 100. An ion beam 108 implants first dopants that settle in the semiconductor body 100 around an end-of-range peak 114 at a peak distance d11 to the first surface 101.

Ion implantation of the first dopants may include one single implantation or several implantations at different implantation energies and/or different implant angles, wherein the implantations result in several end-of-range peaks at different distances to the first surface 101. An implant angle between the ion beam 108 and the normal 104 onto the first surface 101 may be at least 7° for avoiding channeling or may be equal to or less than 7°, e.g., less than 4°, to allow channeling. According to an embodiment ion implantation includes at least one channeled implant at an implant angle smaller 4° between the ion beam 108 and the normal 104.

A heat treatment may diffuse the first dopants, wherein the implant profile is smoothed and a portion of the implanted ions is diffused deeper into the semiconductor body 100.

FIG. 5B shows the surface portion 110 obtained by the heat treatment. The surface portion 110 forms a blanket layer with a first vertical extension d1 along the first surface 101, wherein the first vertical extension d1 of the surface portion 110 is greater than the peak distance d11.

A semiconductor layer 190 is formed by epitaxy on the first surface 101 that forms the starting plane 105 for the epitaxy process.

FIG. 5C shows the semiconductor layer 190 formed between the new first surface 101 of the semiconductor body 100 and the starting plane 105 of the epitaxial growth.

Figure 5D:
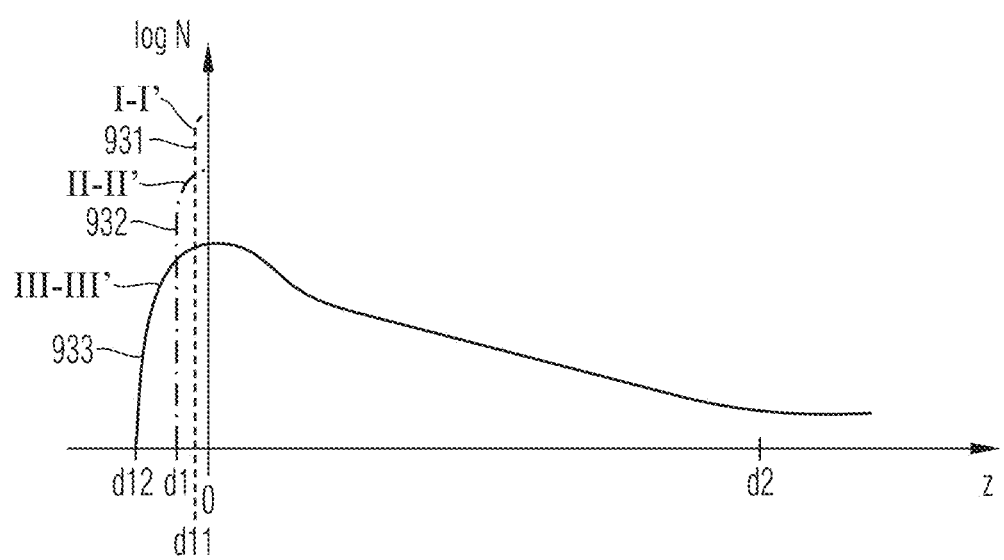
FIG. 5D is a schematic graph illustrating vertical dopant profiles of the semiconductor bodies of FIGS. 5A to 5C.

FIG. 5D shows vertical dopant profiles 931, 932, 933 for the semiconductor bodies of FIGS. 5A to 5C. The first vertical dopant profile 931 of the semiconductor body 100 of FIG. 5A shows one single implant with an end-of-range peak close to the first surface 101. The second vertical dopant profile 932 of FIG. 5B has a larger spreading and approximates a Gaussian distribution.

For z<0 the third vertical dopant profile 933 of FIG. 5C represents a Gaussian distribution defined by further solid-state diffusion from the surface portion 110. For z>0 the third vertical dopant profile 933 is to a significant degree less steep than for z<0.

In case of more than one implant at different acceleration energies, the second dopant profile 932 may include several peaks that may image into smooth steps in the third vertical dopant profile 933 between 0<z<d2.

Figure 6A:
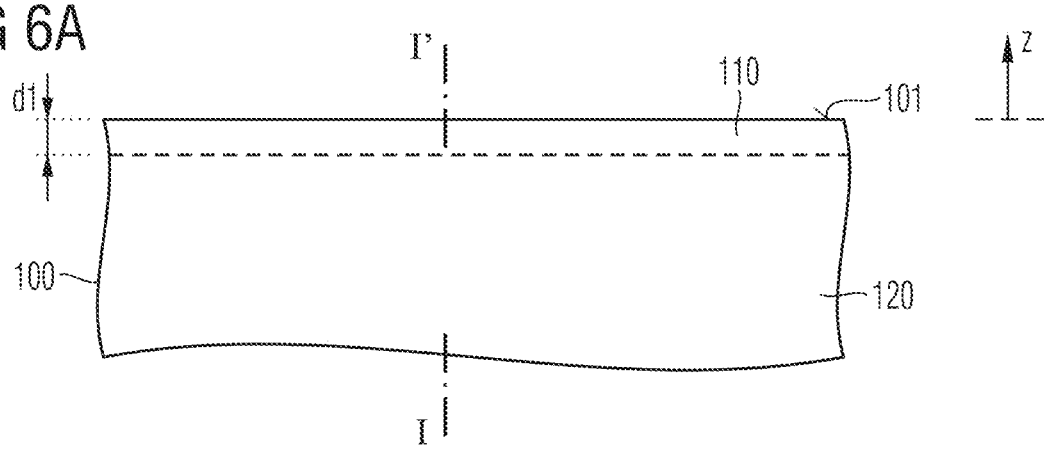
FIG. 6A is a schematic vertical cross-sectional view of a portion of a semiconductor body for illustrating a doping method according to an embodiment defining a dopant dose by epitaxial growth, after forming an auxiliary layer by epitaxy.
Figure 6B:
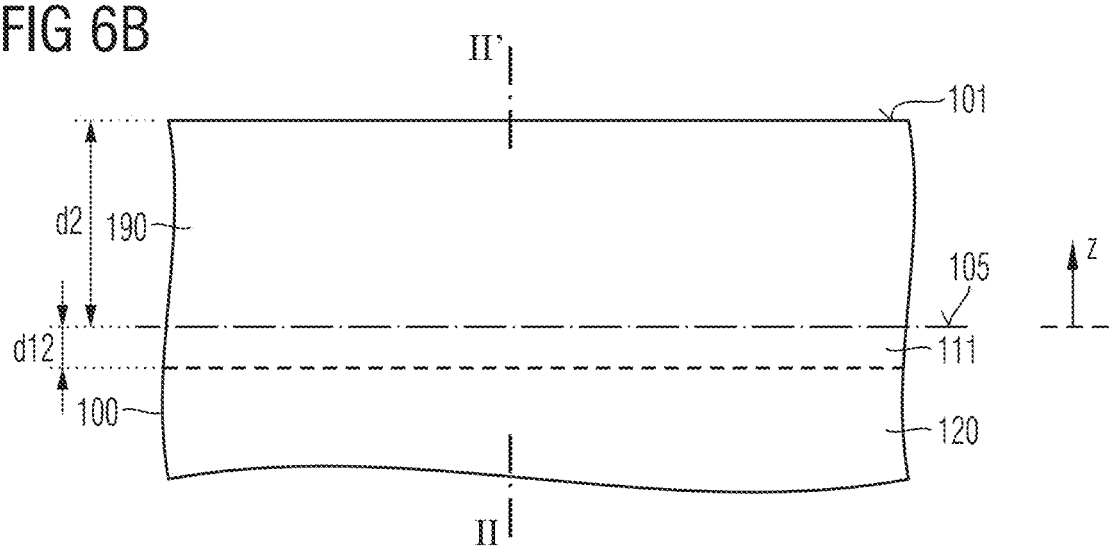
FIG. 6B is a schematic vertical cross-sectional view of the semiconductor body of FIG. 6A, after increasing the thickness of the semiconductor body by epitaxy.
Figure 6C:
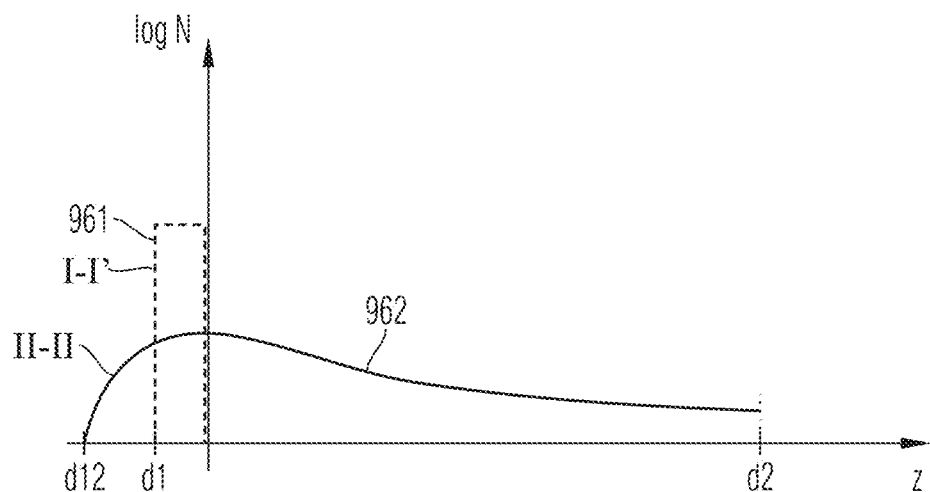
FIG. 6C is a schematic graph illustrating vertical dopant profiles of the semiconductor bodies of FIGS. 6A and 6B.

FIGS. 6A to 6C refer to an embodiment introducing the first dose of dopants and defining the surface portion 110 by deposition of a doped layer.

Thickness of a semiconductor body 100 is increased by depositing an in-situ doped layer on the semiconductor body 100, e.g., by epitaxy.

As illustrated in FIG. 6A the in-situ doped layer forms a surface portion 110 of the semiconductor body 100 and an exposed surface of the surface portion 110 forms the first surface 101. Within the surface portion 110 the dopant concentration may be approximately uniform. A semiconductor layer 190 is formed on the first surface 101, wherein the first surface 101 serves as starting plane 105 for epitaxy and wherein the growing semiconductor layer 190 receives doping atoms predominantly or only by out-diffusion from the surface portion 110.

FIG. 6B shows the semiconductor layer 190 with a vertical extension d2 and a diffused surface portion in with a vertical extension d12 greater than the first vertical extension d1 of the surface portion of FIG. 6A.

In FIG. 6C a first vertical dopant profile 961 refers to the homogenously doped surface portion 110 of FIG. 6A and a second vertical dopant profile 692 shows the dopant distribution in the semiconductor body 100 of FIG. 6B.

The method according to the embodiments may be used to implement doped structures and/or doped layers at a rear side of vertical semiconductor devices as illustrated in the following FIGS.

FIGS. 7A to 7D illustrate the formation of a field stop layer based on the epitaxially grown and auto-doped semiconductor layer 190 of the previous embodiments.

Figure 7A:
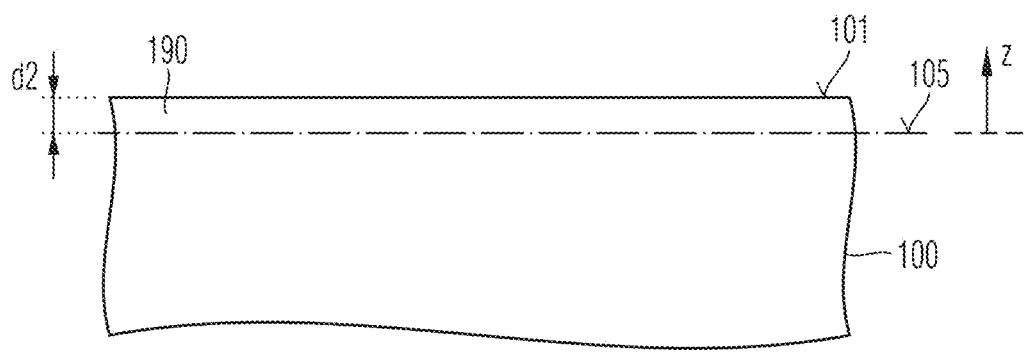
FIG. 7A is a schematic vertical cross-sectional view of a portion of a semiconductor body for illustrating a method of manufacturing a semiconductor device with a field stop layer defined by auto-doping, after forming the field stop layer in a first epitaxial process.

FIG. 7A shows a semiconductor body 100 including a first semiconductor layer 190 formed by epitaxy between the first surface 101 and a starting plane 105 for epitaxy, wherein a vertical dopant profile of the first semiconductor layer 190 is predominantly defined by auto-doping and wherein a vertical extension d2 of the first semiconductor layer 190 may be in a range from 5 μm to 35 μm.

A second semiconductor layer 195 is formed on the first surface 101 defined by the exposed surface of the first semiconductor layer 190, e.g., by a further epitaxy process including in-situ doping and using the exposed surface of the first semiconductor layer 190 as second starting plane 106. A vertical extension d3 of the second semiconductor layer 195 between the new first surface 101 and the second starting plane 106 may be at least 35 μm, for example at least 50 μm or at least 100 μm.

Figure 7B:
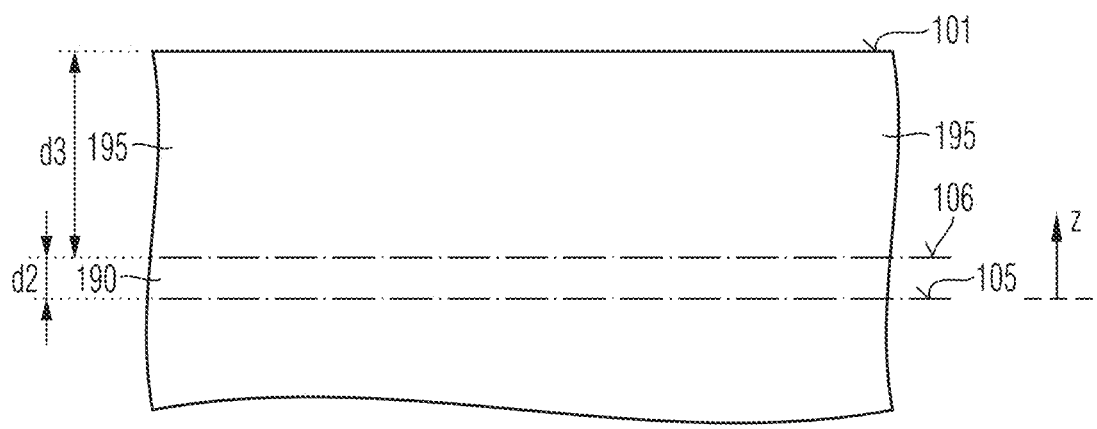
FIG. 7B is a schematic vertical cross-sectional view of the semiconductor body of FIG. 7A, after forming a drift layer on the field stop layer.

FIG. 7B shows the second semiconductor layer 195 formed directly on the first semiconductor layer 190. A mean dopant concentration in the second semiconductor layer 195 may be lower than a minimum dopant concentration in the first semiconductor layer 190. The first and second semiconductor layers 190, 195 may have the same conductivity type.

An anode zone or transistor cells TC may be formed on the first surface 101 of the semiconductor body 100, wherein the first surface 101 is formed by an exposed surface of the second semiconductor layer 195. Formation of the transistor cells TC may include further epitaxy processes, implant processes, high-temperature annealing steps and further patterning processes. A heavily doped contact layer 180 may be formed at the rear side. Formation of the contact layer 180 may include, e.g., a further implant process at the rear side after thinning the semiconductor body 100 from the rear side, wherein the thinning may remove at least partly a diffused surface portion as described above. A rear side electrode 320 may be formed that directly adjoins the contact layer 180. The semiconductor layer 190 is effective as field stop layer.

Figure 7C:
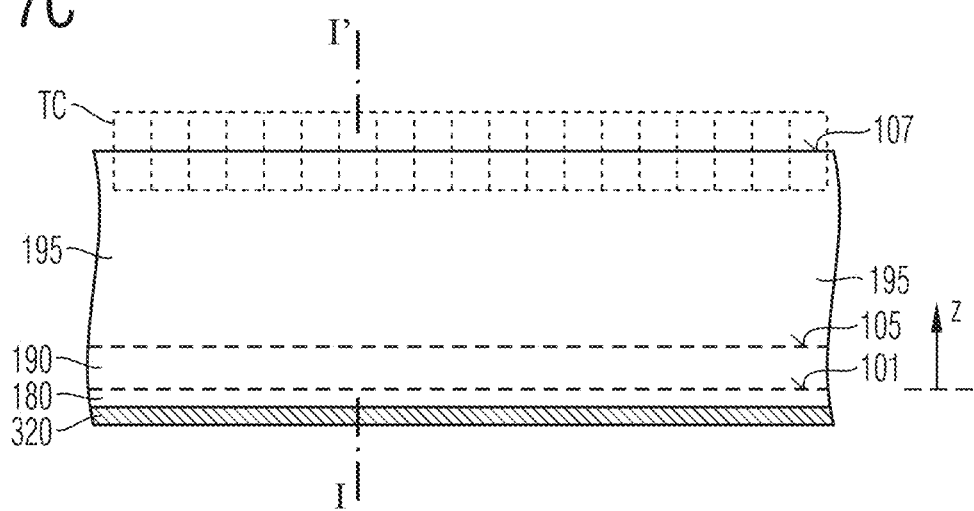
FIG. 7C is a schematic vertical cross-sectional view of the semiconductor body of FIG. 7B, after forming transistor cells in the drift layer.

FIG. 7C schematically shows transistor cells TC formed along a front side of the semiconductor body 100. The transistor cells TC may be bipolar transistor cells, field effect transistor cells or junction field effect transistor cells. The transistor cells TC may be electrically arranged in parallel and may include planar control electrodes, i.e., base electrodes or gate electrodes, or trench control electrodes. The first semiconductor layer 190 is effective as field stop layer and the second semiconductor layer 195 forms a drift zone.

Figure 7D:
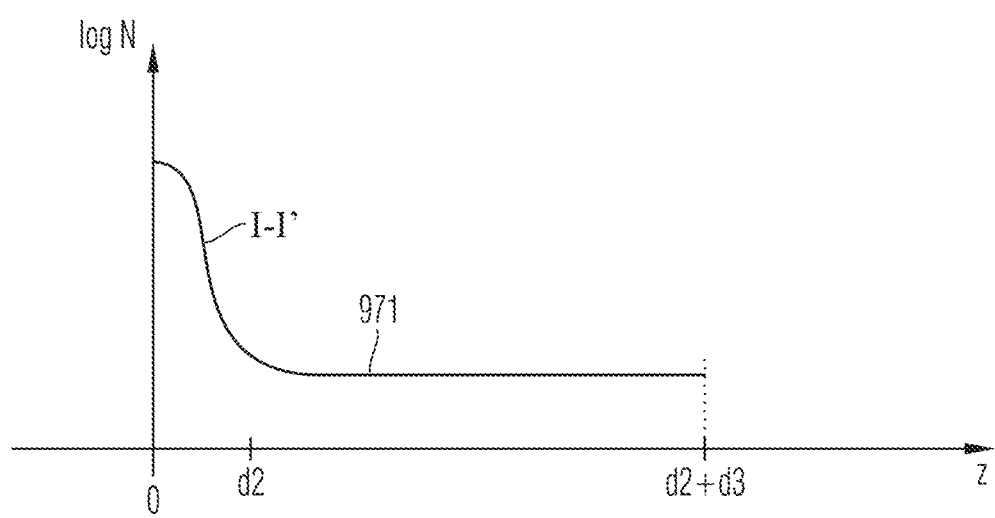
FIG. 7D is a schematic graph illustrating a vertical dopant profile of the semiconductor body of FIG. 7C.

FIG. 7D shows a vertical dopant profile 971 through the first and second semiconductor layers 190, 195 along line I-I' indicated in FIG. 7C. A mean dopant concentration in the second semiconductor layer 195 may be lower than a mean dopant concentration in the first semiconductor layer 190. A total dopant dose between z=0 and z=d2 can be precisely defined by ion implantation. The enhanced auto-doping in the first semiconductor layer 190 results in a comparatively smooth transition of the dopant profile 971 from the field stop layer to the drift zone. In addition, the dopant profile is highly reproducibly.

According to the embodiment illustrated in FIGS. 8A to 8D a semiconductor layer 190 with a vertical dopant profile mainly shaped by auto-doping and with a total dopant content defined by ion implantation forms a drift layer that includes a super-junction structure.

First and second dopants of complementary conductivity type are introduced into the semiconductor body 100 through a first surface 101, e.g., by ion implantation.

Figure 8A:
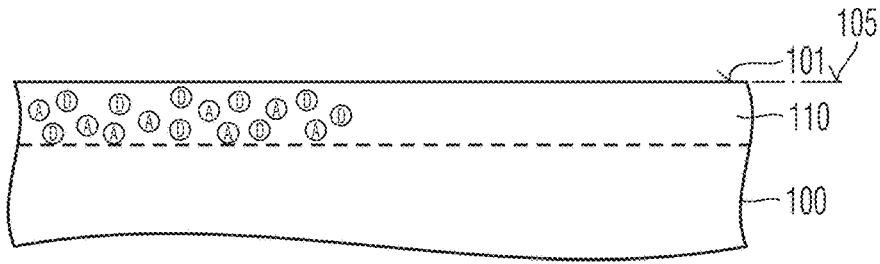
FIG. 8A is a schematic vertical cross-sectional view of a portion of a semiconductor body for illustrating a doping method for forming a superjunction structure, after forming a surface portion containing first and second dopants of complementary conductivity type.

FIG. 8A shows a surface portion 110 including both donors and acceptors, wherein the surface portion 110 may form a blanket layer directly adjoining the first surface 101. A vertical distribution of the donors may differ from a vertical distribution of the acceptors and may be adjusted to compensate for different behavior in the following epitaxy process.

A first semiconductor layer 190 with a vertical extension d2 of at least 5 µm, e.g., at least 20 µm or even at least 50 µm is formed according to the above described embodiments, wherein both donors and acceptors are released from the surface portion 110 and re-incorporated into the first semiconductor layer 190. Trenches 170 are formed in the semiconductor layer 190.

Figure 8B:
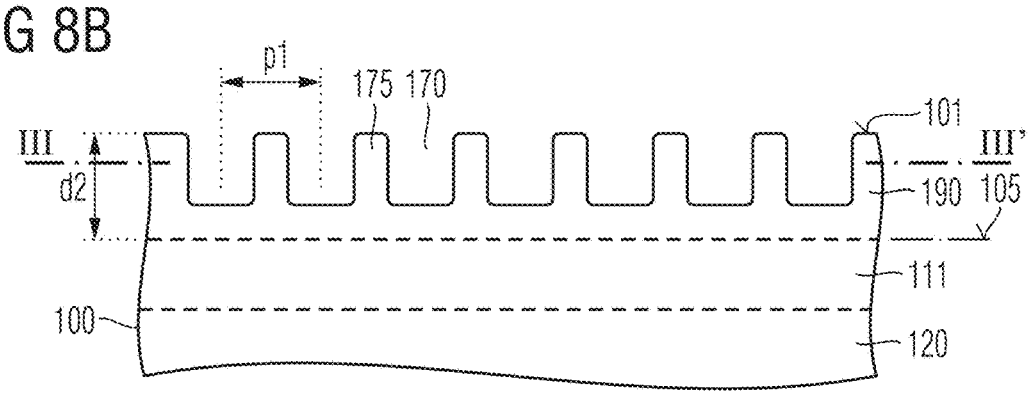
FIG. 8B is a schematic vertical cross-sectional view of the semiconductor body of FIG. 8A, after forming trenches in an epitaxial layer formed on the surface portion, wherein a dopant distribution in the epitaxial layer results to a high degree from auto-doping.
Figure 8C:
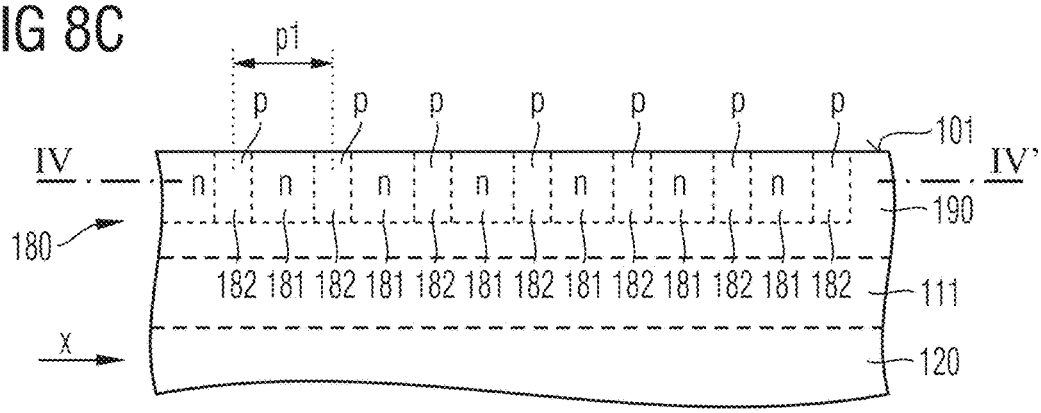
FIG. 8C is a schematic vertical cross-sectional view of the semiconductor body of FIG. 8B, after filling the trenches with semiconductor material.

FIG. 8B shows the trenches 170 extending from the first surface 101 into the first semiconductor layer 190. The trenches 170 may form a regular pattern of equally spaced long trenches having the same lateral and vertical dimensions and a uniform center-to-center distance p1. Mesa portions 175 of the first semiconductor layer 190 separate neighboring trenches 170.

A deposition process fills the trenches 170 with high-resistive semiconductor material. A heat treatment laterally diffuses the donors and acceptors from the mesa portions 175 into the high-resistive semiconductor material that fills the trenches 170. Due to different diffusion constants, the donors and acceptors diffuse at different velocities such that donors and acceptors laterally separate to some degree. For example, fast diffusing acceptor atoms may form p-type columns 182 centered to center axes of the filled trenches 170 and slow diffusing donor atoms may form n-type columns 181 centered to center axes of the mesa portions 175. A center-to-center distance between neighboring p-type columns 182 is equal to the center-to-center distance p1 of the trenches of FIG. 8B.

Figure 8D:
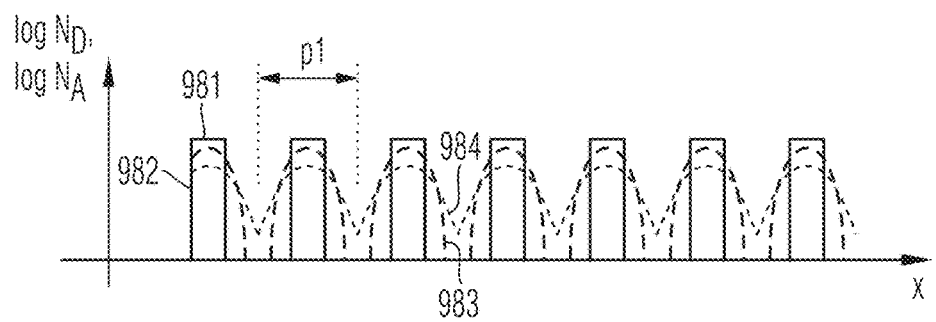
FIG. 8D is a schematic graph illustrating lateral dopant profiles of the portions of the semiconductor bodies of FIGS. 8B and 8C.

In FIG. 8D the lateral donor profile 981 and the lateral acceptor profile 982 along line III-III' in FIG. 8B coincide and indicate a uniform distribution of acceptor and donor atoms in the mesa portions 175. The higher diffusion velocity of acceptor atoms result in that the lateral donor profile 983 and the lateral acceptor profile 984 along line IV-IV' in FIG. 8C differ as regards their spreading.

The vertical donor and acceptor profiles may decrease with decreasing distance to the first surface 101 at approximately the same rate, since the vertical distribution predominantly results from auto-doping instead of solid-state diffusion and since the vertical distribution of donors and acceptors in the surface portion 110 of FIG. 8A may be shaped in an appropriate way.

In the auto-doped first semiconductor layer 190 the vertical homogeneity of the compensation degree of the n-type columns and p-type columns is high. In addition the total amount of both acceptors and donors can be precisely defined such that a superjunction structure formed by the n-type columns 181 and p-type columns 182 can be formed at narrow tolerance windows.

Figure 9A:
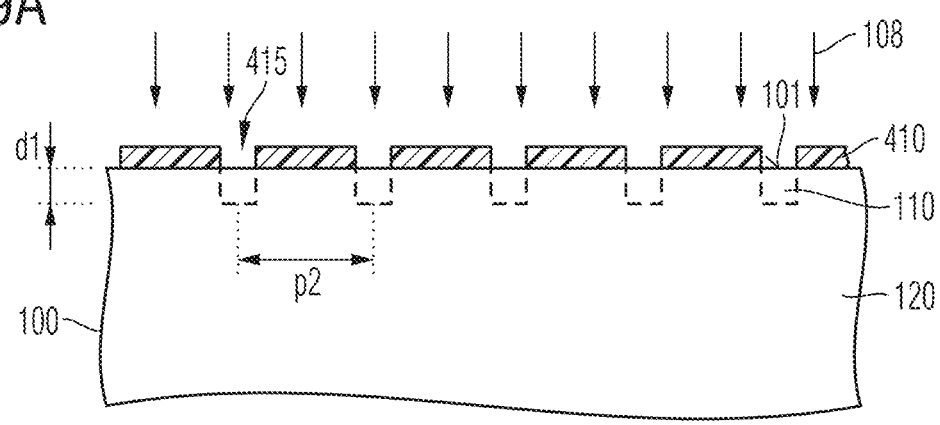
FIG. 9A is a schematic vertical cross-sectional view of a portion of a semiconductor body for illustrating a doping method according to an embodiment concerning a patterned surface portion, after forming the patterned surface portion.
Figure 9B:
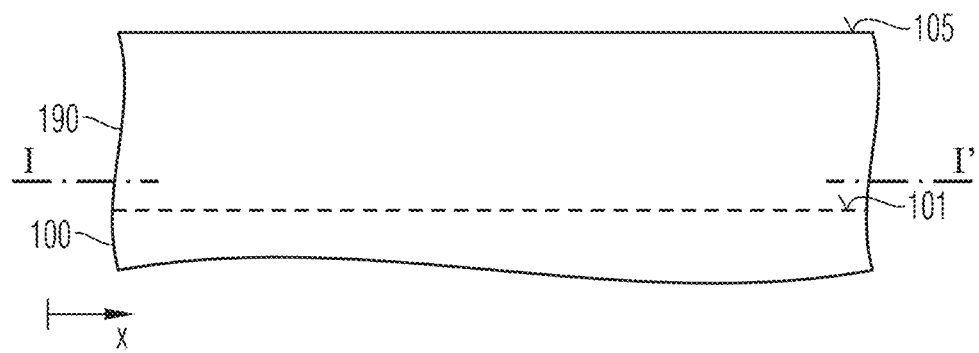
FIG. 9B is a schematic vertical cross-sectional view of the semiconductor body of FIG. 9A, after increasing the thickness of the semiconductor body by epitaxy.
Figure 9C:
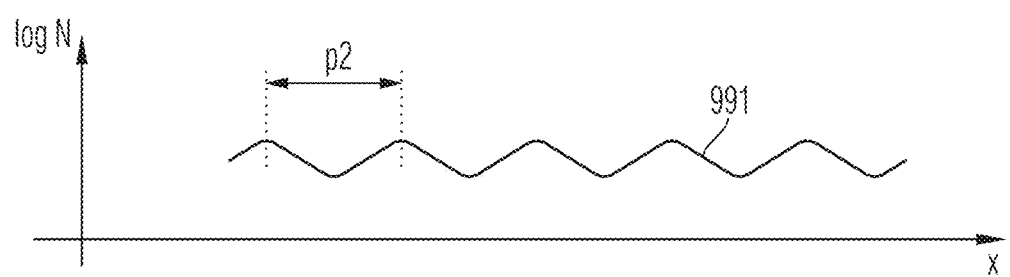
FIG. 9C is a schematic graph illustrating a lateral dopant profile of the semiconductor body of FIG. 9B along line I-I.

FIGS. 9A to 9C show the formation of a patterned surface portion 110. An implant mask layer is deposited on the first surface 101 and patterned by photolithography to form an implant mask 410 covering second portions of the first surface 101 and including mask openings 415 exposing first portions of the first surface 101. The mask openings 415 may form a regular pattern with a center-to-center distance p2 between neighboring mask openings 415.

FIG. 9A shows an ion beam 108 that introduce first dopants through the mask openings 415 to form a surface portion 110 selectively along the first portions of the first surface 101, wherein the surface portion 110 has a vertical extension d1. After removal of the implant mask 410 a semiconductor layer 190 is formed by epitaxy on the first surface 101.

FIG. 9B illustrates the semiconductor layer 190, wherein both lateral and vertical distribution of the dopants in the semiconductor layer 190 can be precisely defined and reproduced at high uniformity.

In FIG. 9C a lateral dopant profile 991 shows a sequence of maxima at a center-to-center distance given by the center-to-center distance p2 of the mask openings 415 illustrated in FIG. 9A.

FIG. 10 illustrates a vertical phosphorus distribution 995 in a semiconductor layer 190 obtained according to the above described embodiments. A semiconductor body includes a concentration of $1\times10^{15}$ $1/cm^3$ boron atoms. An implant at an ion acceleration energy of 80 keV introduces phosphorus atoms into a thin surface portion along a first surface of the semiconductor body. The implanted phosphorus dose is $1\times10^{13} 1/cm^2$. A semiconductor layer 190 is formed on the first surface, wherein the temperature applied during epitaxy is 1100° C. and a deposition rate is 3 µm/min.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing semiconductor device, comprising:
   i) introducing a first dose of first dopants into a semiconductor body having a first surface;
   ii) increasing a thickness of the semiconductor body by forming a first semiconductor layer on the first surface of the semiconductor body, and, while forming the first semiconductor layer, predominantly setting a final dose of doping in the first semiconductor layer by introducing at least 20% of the first dopants from the semiconductor body into at least a part of the first semiconductor layer.

2. The method of claim 1, wherein the first dopants are predominantly introduced into the first semiconductor layer by auto-doping.

3. The method of claim 1, wherein a doping gas supply into a deposition chamber used for forming the first semiconductor layer is turned off while forming the first semiconductor layer.

4. The method of claim 1, wherein the first dopants are introduced into the semiconductor body by an ion implantation process.

5. The method of claim 4, further comprising:
a diffusion process configured to diffuse the first dopants deeper into the semiconductor body.

6. The method of claim 1, wherein the first dopants are introduced into the semiconductor body by a diffusion process.

7. The method of claim 1, wherein a thickness of the first semiconductor layer is set in a range from 2 μm to 200 μm.

8. The method of claim 1, further comprising:
after carrying out ii), increasing a thickness of the semiconductor body by forming a second semiconductor layer on the first surface of the semiconductor body, and setting an average doping concentration in the second semiconductor layer smaller than a minimum average doping concentration in the first semiconductor layer.

9. The method of claim 1, wherein the first semiconductor layer is formed by chemical vapor deposition or another epitaxial deposition in a deposition chamber.

10. The method of claim 9, wherein the first dopants are phosphorus dopants, the first semiconductor layer is formed at a deposition temperature greater than 1100° C., at a pressure in the deposition chamber of lower than 30 Torr, and at a $H_2$ flow rate of smaller than 30 slm.

11. The method of claim 9, wherein the first semiconductor layer is a silicon carbide layer formed on a silicon carbide substrate and the first dopants are nitrogen or phosphorus dopants, the first semiconductor layer is formed at a deposition temperature greater than 1100° C.

12. The method of claim 9, wherein the first dopants are boron dopants, the first semiconductor layer is formed at a deposition temperature greater than 1100° C., at a pressure in the deposition chamber of lower than 30 Torr, and at a HCl flow rate between 0.2 slm to 1 slm.

13. The method of claim 9, wherein the first dopants include arsenic dopants, the first semiconductor layer is formed at a deposition temperature greater than 1100° C., at a pressure in the deposition chamber of larger than 100 Torr, and at a H2 flow rate of smaller than 30 slm.

14. The method of claim 13, wherein the first dopants further include one of phosphorus atoms and antimony atoms.

15. The method of claim 9, wherein at least one process parameter of a deposition temperature, a pressure in the deposition chamber, and a deposition rate is varied during formation of the first semiconductor layer.

16. The method of claim 1, wherein the first semiconductor layer forms a field stop zone or a buffer zone of an insulated gate bipolar transistor or of a diode or of a power MOSFET.

17. The method of claim 1, further comprising:
before carrying out ii), introducing a second dose of second dopants into the semiconductor body through the first surface, the second dopants being of opposite conductivity type than the second dopants.

18. The method of claim 1, wherein the first dopants are introduced through mask openings of an implant mask on the first surface.

19. The method of claim 1, further comprising:
repeating i) and ii) with a second dose of second dopants smaller than the first dose of first dopants.

20. The method of claim 1, further comprising:
before or while carrying out i), increasing a thickness of the semiconductor body from the first surface by forming a doped layer on the semiconductor body.

21. The method of claim 1, further comprising:
finalizing a vertical semiconductor device in the semiconductor body including forming a first load electrode and a control electrode at the first surface of the semiconductor body, and forming a second load electrode at a second surface of the semiconductor body opposite to the first surface.

22. The method of claim 1, wherein
at least 50% of the first dopants are introduced from the semiconductor body into the first semiconductor layer.

23. The method of claim 1, wherein
the first dopants include atoms of at least two different elements.

* * * * *